United States Patent
Wu et al.

(10) Patent No.: US 8,216,864 B2
(45) Date of Patent: Jul. 10, 2012

(54) LED DEVICE AND PACKAGING METHOD THEREOF

(75) Inventors: Chia-Hao Wu, Taipei (TW); Tien-Yu Lee, Taipei (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 56 days.

(21) Appl. No.: 12/649,585

(22) Filed: Dec. 30, 2009

(65) Prior Publication Data

US 2010/0276713 A1 Nov. 4, 2010

(30) Foreign Application Priority Data

Apr. 30, 2009 (CN) .......................... 2009 1 0039189

(51) Int. Cl.
*H01L 21/00* (2006.01)
(52) U.S. Cl. .................... 438/26; 438/27; 257/E33.059; 257/E33.061
(58) Field of Classification Search ........... 257/E33.059, 257/E33.061
See application file for complete search history.

(56) References Cited

U.S. PATENT DOCUMENTS

| 6,417,019 | B1 | 7/2002 | Mueller et al. |
| 6,576,488 | B2 | 6/2003 | Collins, III et al. |
| 6,650,044 | B1 | 11/2003 | Lowery |
| 7,341,818 | B2 | 3/2008 | Wu et al. |
| 2010/0230693 | A1* | 9/2010 | Tran ................................ 257/98 |

* cited by examiner

*Primary Examiner* — Daniel Whalen
(74) *Attorney, Agent, or Firm* — Li & Cai Intellectual Property (USA) Office

(57) ABSTRACT

A LED device includes a base structure having a receiving space, a light-emitting chip, an encapsulating structure, and a phosphor layer. The receiving space is defined by an inner bottom surface of the base structure and an inner side wall surrounding the inner bottom surface. The light-emitting chip is mounted on the bottom of the receiving space. The encapsulating structure is filled into the receiving space to cover the light-emitting chip. The phosphor layer is formed on the encapsulating structure. The dimension of the phosphor layer is more than the dimension of the receiving space and less than 1.5 times that of the receiving space, so as to mount on the top surface of the base structure.

3 Claims, 5 Drawing Sheets

LED DEVICE AND PACKAGING METHOD THEREOF

BACKGROUND OF THE INVENTION

1. Field of the Invention

The present invention relates to a LED device and a packaging method thereof. In particular, the present invention relates to a LED device with a high package efficiency and a stable color uniformity of the light emitted by the LED device, and a packaging method thereof.

2. Description of Related Art

LEDs have a numerous merits, such as small dimension, light weight, fast response, low power consumption, etc, and may be used as the light source of indicators, or displays, as well as other applications. Recently, white-light LEDs have been developed to be used as a light source to replace the tungsten lamp or fluorescent tube.

As shown in FIG. 1, which is a white-light LED of the prior art. A light-emitting chip 12 is located at the bottom of a concave portion 111 of a base 11 and a phosphor layer 13 is filled into the concave portion 111 to cover the light-emitting chip 12. By utilizing the phosphor powder 131 distributed in the phosphor layer 13, part of blue light emitted from the light-emitting chip 12 is converted into yellow light so that the yellow light and the unconverted blue light are mixed to form white light.

However, the white light emitted from the white-light LED may be shifted toward blue light or yellow light in some directions. Because the light path of the light beam L1 emitted from the top surface of the light-emitting chip 12 and the light beam L2 emitted from the side surface of the light-emitting chip 12 in the phosphor layer 13 are longer, the light beams L1, L2 may be converted into yellow light by the phosphor layer 13. Therefore, the light beam emitted from the side surface of the light-emitting chip 12 will be yellow-like so that the color uniformity of the light emitted by the white-light LED would be shifted toward yellow.

SUMMARY OF THE INVENTION

One particular aspect of the present invention is to provide a LED device having a high package efficiency and a uniform color of the light emitted by the LED device.

Another particular aspect of the present invention is to provide a packaging method for a LED device with low-cost. The packaging method can be in widespread use to assure that the LED device include a high package efficiency and a good color uniformity of the light emitted by the LED device.

To achieve the above-mentioned purposes, a LED device is provided. The LED device includes a base structure, a light-emitting chip, an encapsulating structure, and a phosphor layer. The base structure has a receiving space. The receiving space is defined by an inner bottom surface of the base structure and an inner side wall surrounding the inner bottom surface of the base structure. The light-emitting chip is mounted on the bottom of the receiving space. The encapsulating structure is filled into the receiving space to cover the light-emitting chip. The phosphor layer is formed on the encapsulating structure. The dimension of the phosphor layer is more than the dimension of the receiving space and less than 1.5 times the dimension of the receiving space, so as to mount on the top surface of the base structure. Since the mentioned LED device is provided, the light paths of the light beam passing through the phosphor layer are substantially equal. Thus, the color of the light could be uniform. Furthermore, the phosphor layer can be made thinner thereby decreasing loss of the light power and increasing the overall effective package efficiency of light. In addition, the dimension of the phosphor layer is greater than that of the receiving space and thus the phosphor layer can fully cover the lighting area of the light-emitting chip so that light leakage can be avoided. Overall, the color of the light emitted in various angles is substantially same so as color uniformity would be better and the light-emitting view angle would be increased.

Moreover, a packaging method for a LED device is also provided. Steps of the packaging method are as follows. A base having a receiving space is provided. A light-emitting chip is mounted on the bottom of the receiving space. An encapsulating material is injected into the receiving space to assure that the encapsulating material could cover the top surface and the side surfaces of the light-emitting chip. Then, the encapsulating material is solidified. A Phosphor layer is formed on the encapsulating material. The dimension of phosphor layer is greater than the dimension of the receiving space, so that the phosphor layer could be mounted on the top surface of the base. Accordingly, this packaging method can be not only used for the flip chip bonding type of LED, but also applied to general LED, such as a wire bonding type of LED. Furthermore, it can be easy to implement by using the injection way and the cost would be decreased.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

In the following illustration, it is noted that similar elements are labeled as the same label.

Figure 6A:
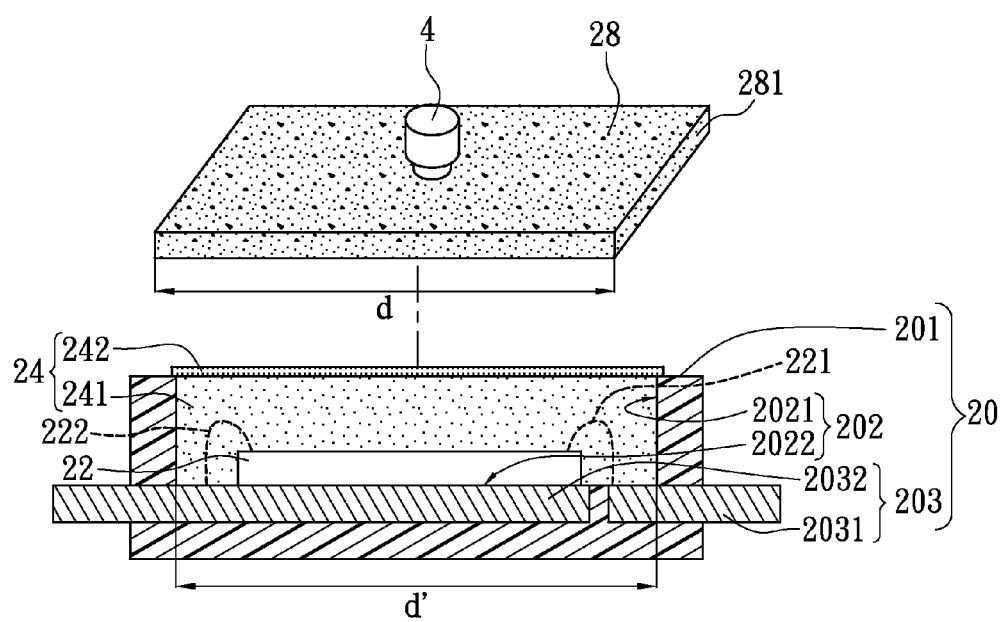
FIG. 6A is a schematic diagram of a step S4 in the packaging method for a LED device according to the first embodiment of the present invention.
Figure 7A:
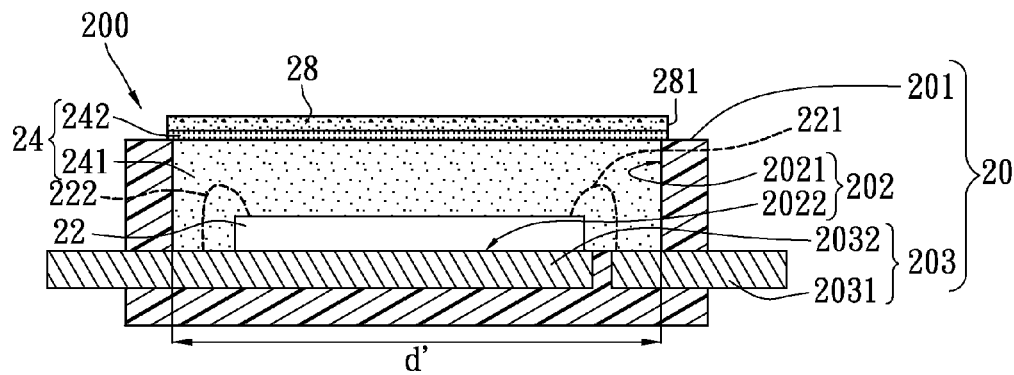
FIG. 7A is a schematic diagram of the LED device according to the first embodiment of the present invention.

Please Refer to FIG. 7A, which shows a LED device 200 according to the first embodiment of the present invention. The LED device 200 includes a base structure 20, a light-emitting chip 22, an encapsulating structure 24 and a phosphor layer 28. The base structure 20 has a receiving space 202. The receiving space 202 is defined by an inner bottom surface 2022 of the base structure 20 and an inner side wall 2021 surrounding the inner bottom surface 2022. The light-emitting chip 22 is mounted on the bottom of the receiving space 202 (i.e. the inner bottom surface 2022 of the base structure 20). In a preferred embodiment, the light-emitting chip 22 is mounted on a geometrical center of the receiving space 202. The inner side wall 2021 of the base structure 20 is substantially parallel to surrounding the edge of the light-emitting chip 22, preferably. That is to say, the inner side wall 2021 of the base structure 20 is an upright inner side surface around the edge of the inner bottom surface 2022, when the side surface of the light-emitting chip 22 is vertical to the bottom surface of the light-emitting chip 22. In this embodiment, the encapsulating structure 24 including an encapsulating material 241 and a thinner macromolecule layer 242 is formed in the receiving space 202 to cover the light-emitting chip 22, i.e. including the top surface and the side surfaces of the light-emitting chip 22. The encapsulating structure 24 is fully filled into the receiving space 202 of the base structure 20 to form a plat upper surface. That is to say, the upper surface of the encapsulating structure 24 and the top surface 201 of the base structure 20 are approximately level with each other. The phosphor layer 28 is formed on the encapsulating structure 24. The dimension (i.e. length d shown in FIG. 6A) of the phosphor layer 28 is greater than the dimension (i.e. length d' in FIG. 6A) of the receiving space 202 and preferably smaller than 1.5 times the dimension of the receiving space 202. The edge 281 of the phosphor layer 28 is mounted on the top surface 201 of the base structure 20. The base structure 20 further includes a conduct structure 203 electrically connected the light-emitting chip 22 with an external electrical power. In this embodiment, the light-emitting chip 22 is electrically connected to the conduct structure 203 within the base structure 20 by wire bonding. That is to say, the light-emitting chip 22 can be electrically connected to positive and negative conduct elements 2031, 2032 of the conduct structure 203 via connection wires 221, 222, respectively.

The phosphor layer 28 is a phosphor powder paste flake or a layer with a macromolecule material and phosphor powder, and its thickness is uniform. The encapsulating structure 24 is a macromolecule glue, such as epoxide, silicone, or other macromolecule compounds with a long chain structure. The light-emitting chip 22 can emits light beam with a wavelength from UV to IR. In a preferred embodiment, the base structure 20 is stacked by a multi-layer ceramic.

Figure 7B:
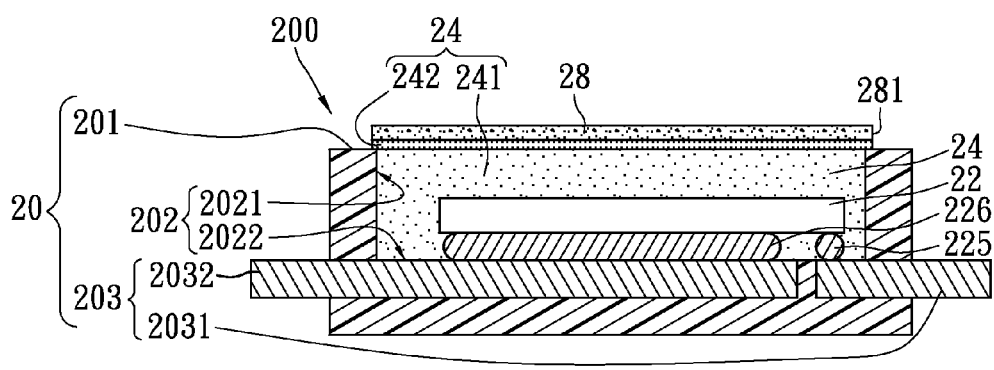
FIG. 7B is a schematic diagram of the LED device according to the second embodiment of the present invention.

Please refer to FIG. 7B, which is a LED device 200 according to the second embodiment of the present invention. The LED device of the second embodiment is similar to that of the first embodiment. The difference between the first and second embodiments is that the light-emitting chip 22 is formed in the receiving space 202 of the base structure 20 by flip chip bonding and the light-emitting chip 22 is electrically connected to the positive and negative conduct elements 2031, 2032 of the conduct structure 203 via solder pads 225, 226.

Figure 1:
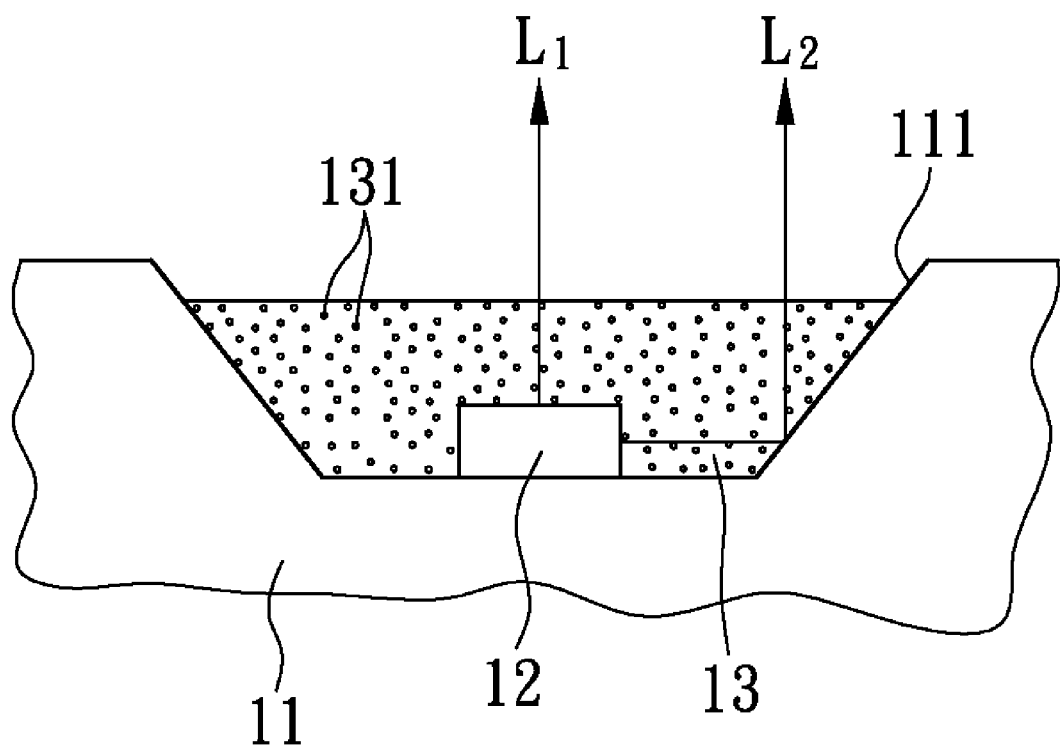
FIG. 1 is a schematic diagram of a LED according to the prior art.
Figure 2:
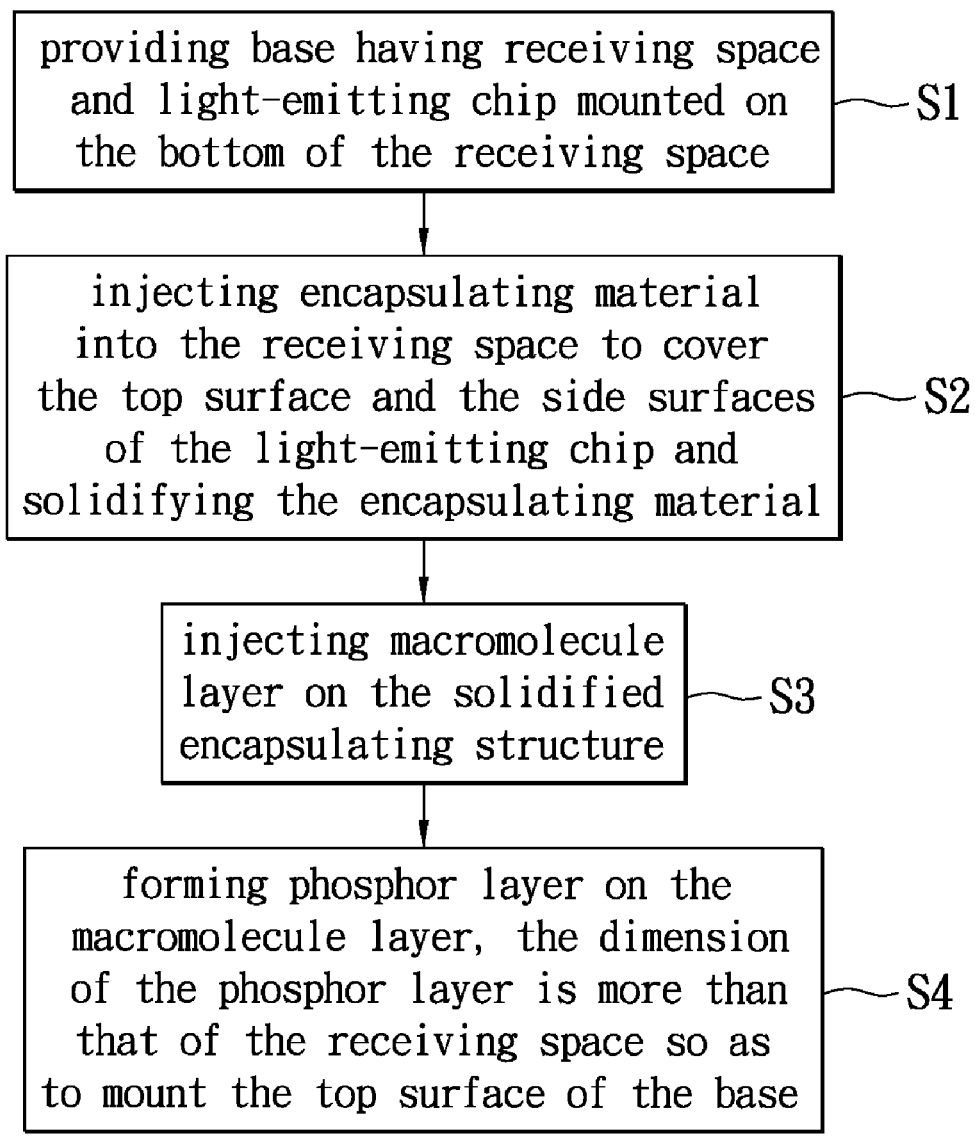
FIG. 2 is a flow chart of the packaging method for a LED device according to a first embodiment of the present invention.

In order to package the LED device 200 shown in FIG. 7A or 7B, a packaging method for a LED device is provided (as shown in FIG. 2) and includes the following steps.

Step S1 is a step of providing a base having a receiving space and mounting a light-emitting chip on the bottom of the receiving space.

Step S2 is a step of injecting an encapsulating material such as a transparent packaging glue into the receiving space of the base to cover the top surface and the side surfaces of the light-emitting chip and then solidifying the encapsulating material.

Step S3 is a step of injecting a thinner macromolecule layer on the solidified encapsulating material.

Step S4 is a step of forming a phosphor layer formed on the thinner macromolecule layer, in which the dimension of the phosphor layer is greater than the dimension of the receiving space, so that the edge of the phosphor layer is mounted on the top surface of the base.

Figure 3A:
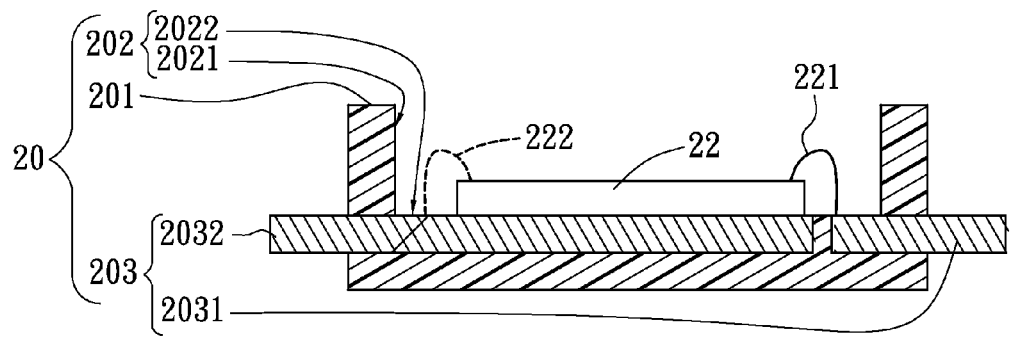
FIG. 3A is a schematic diagram of a step S1 in the packaging method for a LED device according to the first embodiment of the present invention.

Refer to FIG. 3A. In the step S1, the base structure 20 is provided. The base structure 20 includes a receiving space 202. The receiving space 202 is defined by an inner bottom surface 2022 of the base structure 20 and an inner side wall 2021 surrounding the edge of the inner bottom surface 2022. The light-emitting chip 22 is mounted on the inner bottom surface 2022 of the base structure 20 within the receiving space 202. The light-emitting chip 22 is electrically connected with the positive and negative conduct elements 2031, 2032 of the conduct structure 203 via the connection wires 221, 222 so as to connect an external electric power for obtaining power to light the light-emitting chip 22.

Figure 3B:
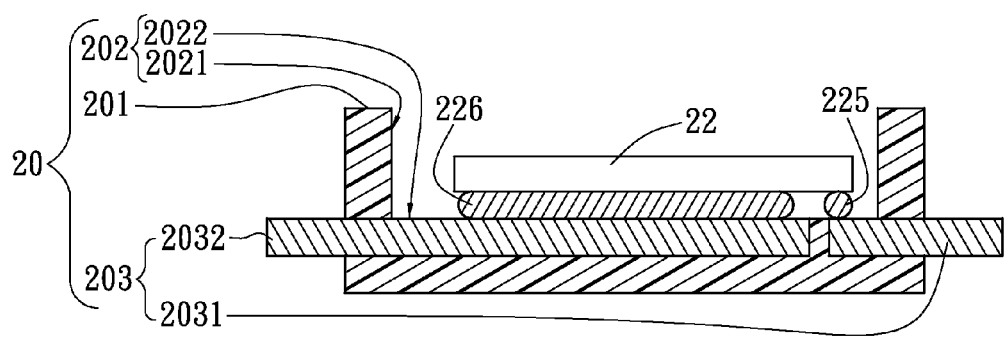
FIG. 3B is a schematic diagram of a step S1 in the packaging method for a LED device according to a second embodiment of the present invention.

Refer to FIG. 3B, which shows the second embodiment. In a step S1, a base structure 20 is provided. The base structure 20 has a receiving space 202. The receiving space 202 is defined by an inner bottom surface 2022 of the base structure 20 and an inner side wall 2021 surrounding the edge of the inner bottom surface 2022. A light-emitting chip 22 is mounted on the receiving space 202 of the base structure 20 by flip chip bonding and electrically connected with the positive and negative conduct elements 2031, 2032 of the conduct structure 203 via the solder pads 225, 226 so as to connect an external electric power for obtaining power to light the light-emitting chip 22.

According to FIGS. 3A and 3B, the packaging method can be applied to both the flip chip bonding type of LED and the wire bonding type of LED.

Figure 4:
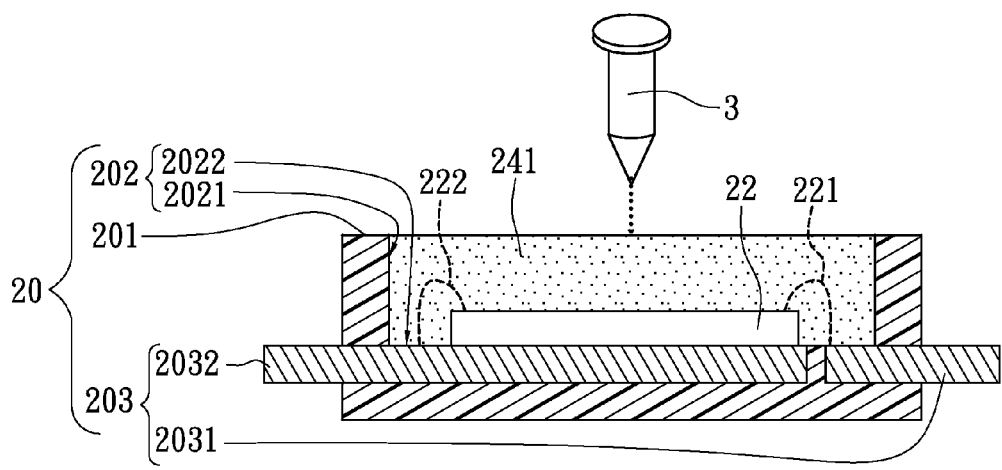
FIG. 4 is a schematic diagram of a step S2 in the packaging method for a LED device according to the first embodiment of the present invention.

Refer to FIG. 4. In the step S2, an injection device 3 is used for injecting the encapsulating material 241 into the receiving space 202 of the base structure 20 to allow the encapsulating material 241 to cover the top surface and the side surfaces of the light-emitting chip 22. The encapsulating material 241 is fully filled in the receiving space 202. Then, the encapsulating material 241 is solidified. The encapsulating material 241 can be epoxide, silicone, or other macromolecule compounds with a long chain structure. In this embodiment, the encapsulating material 241 is silicone, preferably.

Figure 5:
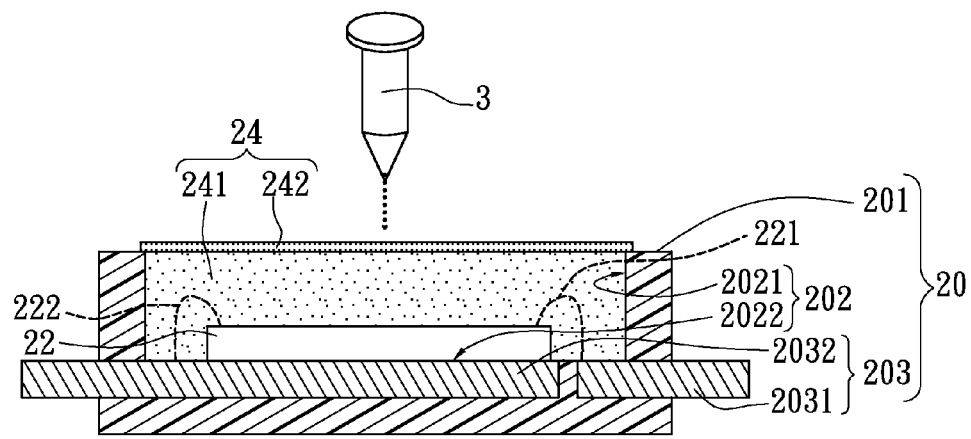
FIG. 5 is a schematic diagram of step S3 of the packaging method for a LED device according to the first embodiment of the present invention.

Refer to FIG. 5. After the encapsulating material 241 in step S2 is solidified, a thinner macromolecule layer 242 is injected on the encapsulating material 241. The material of the thinner macromolecule layer 242 could be the same as the encapsulating material 241 so that it can be epoxide, silicone, or other macromolecule compounds with a long chain structure. The thickness of the thinner macromolecule layer 242 is smaller than the height of the receiving space 202 or the height of the structure defined by the encapsulating material 241. In this embodiment, the thinner macromolecule layer 242 is silicone, preferably. However, in some situation, after the solidifying process of the step S2, the encapsulating material 241 may shrink. It may be resulted in a concave top surface of the solidified encapsulating material 241. That is to say, the thinner macromolecule layer 242 would be used for filling this non-smooth top surface of the solidified encapsulating material 241. Thus, an approximate smooth top surface of the encapsulating structure 24 composed of the encapsulating material 241 and the thinner macromolecule layer 242 can be provided. In addition, if the quantity of the encapsulating material 241 injected in the step S2 is much enough to form a smooth surface in the top surface of the encapsulating material 241, the step S3 can be omitted. Thus, the encapsulating structure 24 will be only formed of the encapsulating material 241.

In this embodiment, two times of injection molding are used for forming the encapsulating structure 24 to prevent the deformation from occurring after the encapsulating material is solidified. Therefore, the phosphor layer 28 can be easily pasted. For example, when the phosphor powder flake in the prior art does not fully cover the surface of the chip and the blue light is emitted from the side of the chip whereby a non-uniform chromaticity for the prior LED device is generated. Thus, the problem can be overcome by the thinner macromolecule layer 242 to make the surface of the encapsulating structure 24 more smooth and sticky. Further, it is easy to paste the phosphor layer 28 and the encapsulating structure 24 in the step S4, and the non-uniform chromaticity can be avoided.

The thinner macromolecule layer 242 is also used for leveling the upper surface of the encapsulating structure 24 and the top surface 201 of the base structure 20, and thus the step S4 could be implemented easily. In addition, the thickness of the thinner macromolecule layer 242 is smaller than the thickness of the phosphor layer 28, preferably.

Refer to FIG. 6A. In the step S4, a pick-up device 4 is used for picking up a phosphor powder flake 28 to be pasted onto the thinner macromolecule layer 242. In a preferred embodiment, the shape of the phosphor powder flake 28 could correspond to the shape of the inner bottom portion 2022 of the receiving space 202. For example, when the inner bottom portion 2022 of the receiving space 202 is rectangular, the phosphor powder flake 28 is also rectangular. The length d of the phosphor powder flake 28 is larger than the length d' of the inner bottom portion 2022 of the receiving space 202 and the width of the phosphor powder flake 28 is also larger than the width of the inner bottom portion 2022 of the receiving space 202. Therefore, when the phosphor powder flake 28 is pasted onto the thinner macromolecule layer 242, the edge 281 of the phosphor powder flake 28 is mounted on the top surface 201 of the base structure 20 so that the phosphor powder flake 28 fully covers the receiving space 202.

Figure 6B:
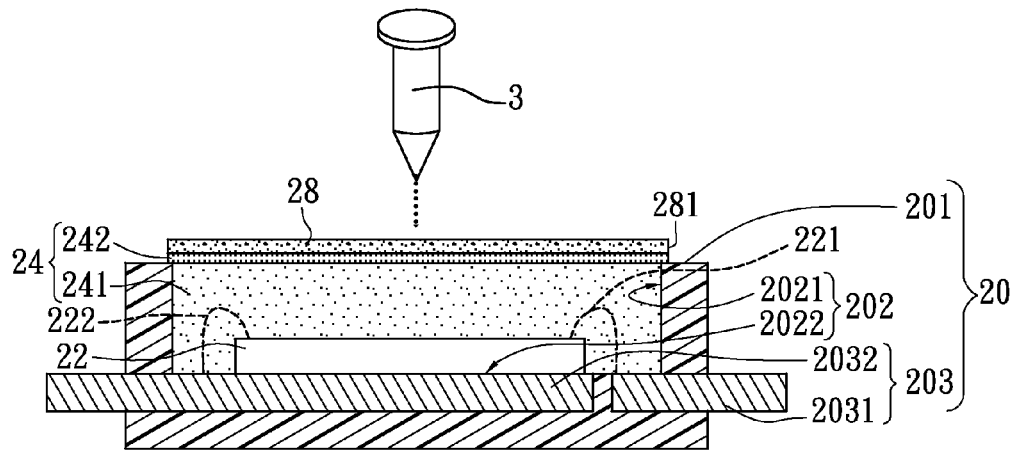
FIG. 6B is a schematic diagram of a step S4 in the packaging method for a LED device according to the second embodiment of the present invention.

Refer to FIG. 6B. The step S4 also can be implemented by the injection way. A macromolecule material with phosphor powder is injected on the thinner macromolecule layer 242 by an injection device 3 to form a phosphor layer 28, and the dimension of the phosphor layer is more than that of the receiving space 202 so that the edge 281 of the phosphor powder flake 28 can be mounted on the top surface 201 of the base structure 20 to fully cover the receiving space 202.

In a preferred embodiment, after the step S4, a step of solidifying the thinner macromolecule layer 242 is provided. This solidifying process is the same as the step S2 of solidifying the encapsulating material 241. In a preferred embodiment, the solidifying process is a curing process.

In this embodiment, there are two steps of curing processes to prevent air bubbles from occurring due to the expansion coefficients of the encapsulating material and the phosphor powder flake are different. Alternatively, it can prevent the phosphor layer formed by injection process and the encapsulating material from mixing during the curing process.

By applying the steps S1~S4, the LED device 200, as shown in FIG. 7A or 7B would be packaged.

The light-emitting chip 22 of the LED device 200 is mounted on the inner bottom surface 2022 of the receiving space 202 of the base structure 20. The top surface and the side surfaces of the light-emitting chip 22 are covered with an encapsulating structure 24. The phosphor layer 28 is formed on the encapsulating structure 24. Therefore, the light paths in the phosphor layer 28 are equal so that the color of the light emitted by the LED device 200 is uniform. Further, the thickness of the phosphor layer 28 can be reduced so that the light loss is reduced and the package efficiency is enhanced. Furthermore, the dimension of the phosphor layer 28 is more than the dimension of the receiving space 202 and the edge of the phosphor layer 28 is mounted on the top surface 201 of the base structure 20 so that the phosphor layer 28 fully covers the light-emitting area of the light-emitting chip 22, whereby the light leakage can be avoided. The color of the light emitted by the LED device 200 is uniform and the light-emitting view angle is wide.

In addition to be applied to the flip chip bonding type of LED, the packaging method also can be applied to a general LED, such as a wire bonding type of LED. It is easy to implement the packaging method by using the injection way, and its cost is low. Moreover, by using two steps of injection processes and two steps of solidifying processes to from the encapsulating structure, the phosphor layer can be easily pasted to avoid generating air bubbles and a non-uniform color. Therefore, the present packaging method can be applied to a variety of LEDs and includes low cost. The package efficiency of the present LED device could be high, the color thereof is uniform and the light-emitting view angle thereof is wide.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A packaging method for a LED device, comprising the steps of:
   providing a leadframe set (20) having a positive conduct element (2031) and a negative conduct element (2032) spaced from each other;
   forming a casing on the leadframe set to isolate the positive conduct element and the negative conduct element from each other, wherein the leadframe set and the casing cooperatively define a receiving space;
   mounting a light emitting chip (22) on one of the positive and the negative conduct elements of the leadframe set at the bottom portion of the receiving space and connecting the light-emitting chip to the positive and the negative conduct elements;
   injecting an encapsulating material into the receiving space to cover the top surface and the side surfaces of the light emitting chip and solidifying the encapsulating material;
   injecting a macromolecule layer (242) on the solidified encapsulating material;
   forming a phosphor layer (28) on the solidified encapsulating material; and
   solidifying the macromolecule layer after the formation of the phosphor layer, wherein the dimension of the phosphor layer is greater than that of the receiving space so as to be mounted on the top surface of the leadframe set.

2. The packaging method as claimed in claim 1, wherein the step of forming the phosphor layer on the solidified encapsulating material is to paste a phosphor powder flake or inject a layer with a macromolecule material and phosphor powder.

3. The packaging method as claimed in claim 1, wherein the dimension of the phosphor layer is less than 1.5 times that of the receiving space.

* * * * *